United States Patent
Bulow et al.

(10) Patent No.: US 7,748,939 B2
(45) Date of Patent: Jul. 6, 2010

(54) CAPTIVE FASTENER WITH UNIQUE ENGAGING AND LOCKING MECHANISM

(75) Inventors: Jeffrey A. Bulow, Syracuse, NY (US); Ronald D. Gagnon, Cazenovia, NY (US); Jeramy K Amidon, Constantia, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 378 days.

(21) Appl. No.: 11/747,591

(22) Filed: May 11, 2007

(65) Prior Publication Data

US 2008/0279651 A1    Nov. 13, 2008

(51) Int. Cl.
*F16B 21/00*    (2006.01)
(52) U.S. Cl. ...................................... 411/349; 411/553
(58) Field of Classification Search ................ 411/347, 411/349, 549, 553, 554, 350; 24/297
See application file for complete search history.

(56) References Cited

U.S. PATENT DOCUMENTS

| | | | | |
|---|---|---|---|---|
| 3,470,524 A | * | 9/1969 | Culver | 439/317 |
| 3,589,423 A | * | 6/1971 | Metz | 411/262 |
| 4,069,855 A | | 1/1978 | Petroshanoff | |
| 4,297,063 A | * | 10/1981 | Hart | 411/199 |
| 4,709,454 A | * | 12/1987 | Barnes | 24/573.11 |
| 4,887,929 A | * | 12/1989 | Hale | 403/328 |
| 5,484,240 A | | 1/1996 | Rosenberg | |
| 5,597,280 A | | 1/1997 | Stern | |
| 5,603,536 A | * | 2/1997 | Bauer et al. | 292/144 |
| 5,692,851 A | * | 12/1997 | Pace | 403/31 |
| RE36,351 E | * | 10/1999 | Yamamoto et al. | 280/728.2 |
| 6,860,454 B1 | | 3/2005 | Gronowicz, Jr. | |

OTHER PUBLICATIONS

Southco Quarter-turn Fasteners, pp. 269-291.
SPS Technologies, Series 3000 Structural Panel Fasteners.
Fairchild Fasteners, pp. 714-747.

* cited by examiner

*Primary Examiner*—Gary Estremsky
(74) *Attorney, Agent, or Firm*—Daniel P. Malley; Bond, Schoeneck & King, PLLC

(57) ABSTRACT

A captive fastener generally comprising a receptacle, a bayonet assembly, and a locking assembly for locking the bayonet assembly to the receptacle. The receptacle extends along a longitudinal axis and includes a pair of parallel extending spiral raceways formed in the inner surface of a central opening that extends therethrough, and a keyway formed adjacent its terminus. The bayonet assembly includes a pair of bayonets that are adapted to ride in the raceways and a key positioned at the end of a plunger and is adapted to engage the keyway thereby locking the bayonet assembly in the receptacle. The locking assembly includes the plunger that when manipulated by a tool either engages or disengages the key from the keyway.

12 Claims, 5 Drawing Sheets

CAPTIVE FASTENER WITH UNIQUE ENGAGING AND LOCKING MECHANISM

BACKGROUND OF THE INVENTION

1. Field of Invention

The present invention relates generally to fasteners and more particularly to captive fasteners used to secure components in racks in high vibration and other hostile environments.

2. Description of Prior Art

Racks are used to house electronic components and devices, such as RADAR transmitters, computers, and the like. Oftentimes, these racks are included on moving articles, such as ships, aircraft, and other articles that induce vibrations to the racks. To maintain a clean environment for the rack mounted components as well as secure their positions within the rack, captive fasteners are used to attach panels and other items to the rack to improve structural and environmental integrity. The term "captive" refers to the fixed engagement of one part of the fastener in a panel/cover and the fixed engagement of the second part of the fastener in the rack/housing to which the panel/cover is to be attached.

When the rack mounted components need to be accessed, for instance for repair or replacement, the panels obviously need to be removed in order to gain access. Due to the number of fasteners and the strength associated with these fasteners, it takes significant time to remove them. For instance, fasteners used on one radar transmitter cover exceed 12 minutes to remove and recommended industry fasteners are threaded and require up to 8 turns to seat; the longevity associated with these fasteners are questionable, as is reliability due to captive washer breaks.

3. Objects and Advantages

It is therefore a principal object and advantage of the present invention to provide a fastener that engages and disengages with less than a full rotation to ease the difficulty associated with removal and securing the fastener, as well as increasing the speed with which fastener manipulation can be performed.

It is another object and advantage of the present invention to provide a fastener that minimizes affects of vibration.

It is a further object and advantage of the present invention to provide a fastener that can secure variable sized loads.

Other objects and advantages of the present invention will in part be obvious, and in part appear hereinafter.

SUMMARY OF THE INVENTION

In accordance with the foregoing objects and advantages, the present invention provides a captive fastener generally comprising a receptacle, a bayonet assembly, and a locking assembly for locking the bayonet assembly to the receptacle. The receptacle extends along a longitudinal axis and includes a bore formed longitudinally therein that is defined by an interior surface and extends from its open end to a shoulder formed within the receptacle, a first raceway formed in the interior surface and extending in a predetermined pattern along at least a portion of the length of the interior surface, and a keyway formed in axial alignment and fluid communication with the bore and extending axially from the shoulder. The bayonet assembly comprises an elongated, hollow shaft adapted for axial engagement within the bore, and a first bayonet extending outwardly from the shaft and adapted for seated engagement within the first raceway. The locking assembly is mounted for axial movement within the hollow shaft and includes a key that moves between engaged (locked) and disengaged (unlocked) relation relative to the keyway.

In one aspect of the present invention the raceway extends in a spiral pattern longitudinally along the interior surface and revolves between about 120 and 180 degrees around the interior surface. Preferably, the raceway revolves about 120 degrees around the interior surface and extends essentially the full length thereof. This geometry produces a fastener that requires approximately one quarter turn to less than one half turn of a tool engaged with the receptacle to fasten or unfasten the fastener.

In its preferred form, the locking assembly comprises an elongated plunger longitudinally positioned within the hollow shaft; a set screw statically positioned in the hollow shaft in axial alignment with the plunger; a bias element positioned within the shaft between the set screw and the plunger; and a non-circularly shaped key securely mounted to the end of said plunger opposite said bias element and adapted for reciprocating movement into and out of said keyway.

In use the bayonet assembly is fixed to the substructure and its shaft extends through aligned opening formed through the substructure and removable panel. The receptacle is axially aligned with the bayonet assembly's shaft and the notches that lead to the raceway is aligned with the bayonet. The receptacle is then slid over the shaft until the bayonet engages the raceway at which point the receptacle both rotates about its longitudinal axis and moves axially along the shaft with the bayonet riding in the raceway.

A standard hex-head/Allen wrench or a specialized tool having hex-head/Allen wrench bit is used to engage the hex opening formed in the receptacle head and rotates the receptacle. The hex opening formed in the receptacle head is compound, concentric socket with the smaller diameter socket extending longitudinally deeper into the receptacle head by approximately a factor of two the larger diameter hex socket depth. Once the bayonet reaches the end of the raceway, the key will be biased against the shoulder that defines the keyway and by continuing to rotate the receptacle, the bias member will compress and bias the key outwardly until it passes into engaged relation to the keyway. To remove the receptacle, a smaller tool is longitudinally inserted through the smaller opening formed through the head and put into engagement with the key. The key can then be forced longitudinally by the tool out of engagement with the keyway, and the receptacle rotated to take the key out of alignment with the keyway. The receptacle can then be slid and rotated (as the bayonet travels along the raceway). Due to the steep lead angle of the raceway, the receptacle need only be turned manually a quarter turn or less to effect the disengagement of the receptacle from the bayonet assembly.

BRIEF DESCRIPTION OF THE DRAWINGS

The present invention will be more fully understood and appreciated by reading the following Detailed Description in conjunction with the following drawings, in which.

DETAILED DESCRIPTION

Figure 1:
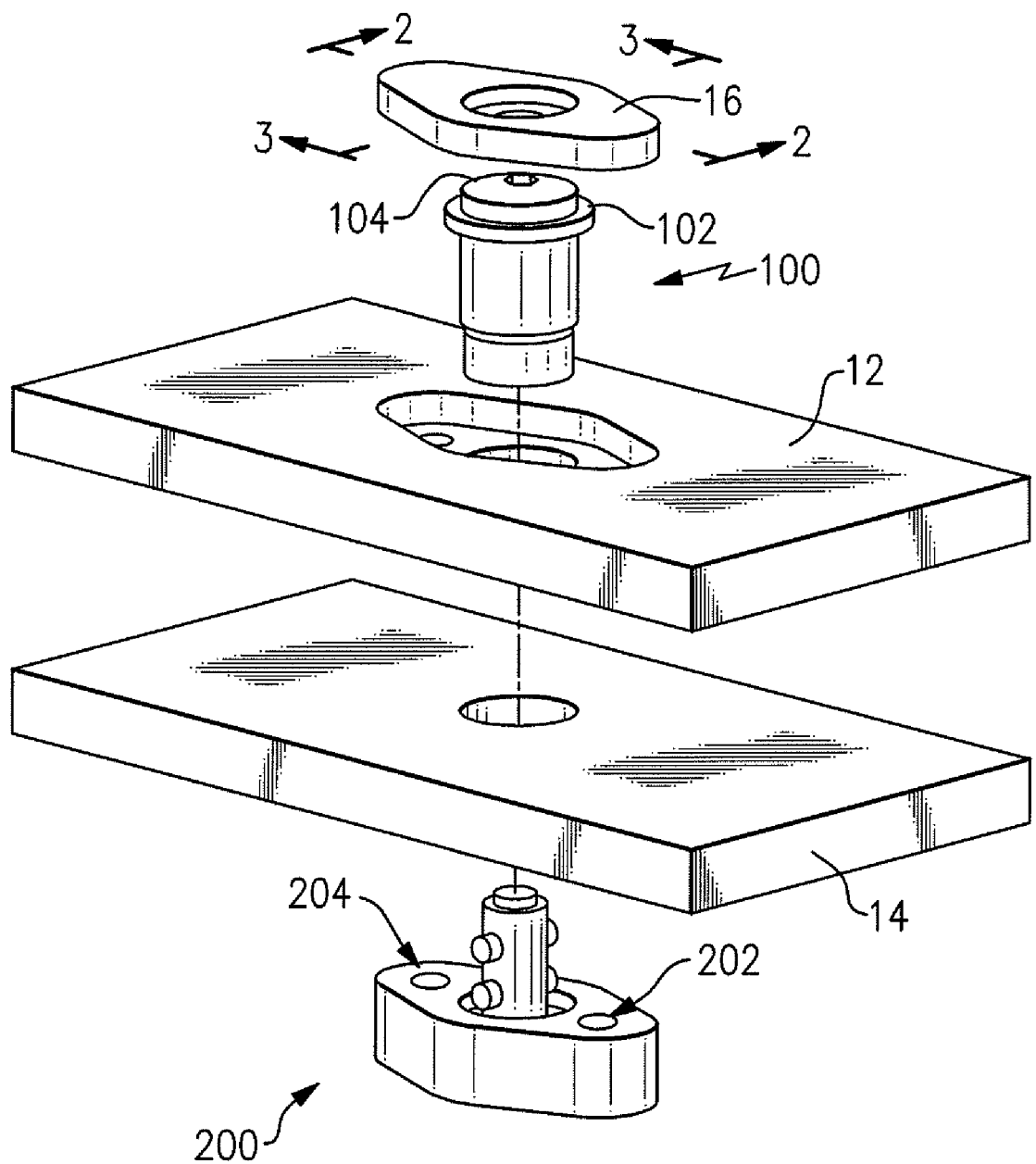
FIG. 1 is an exploded perspective view of the captive fastener in accordance with the present invention.
Figure 2:
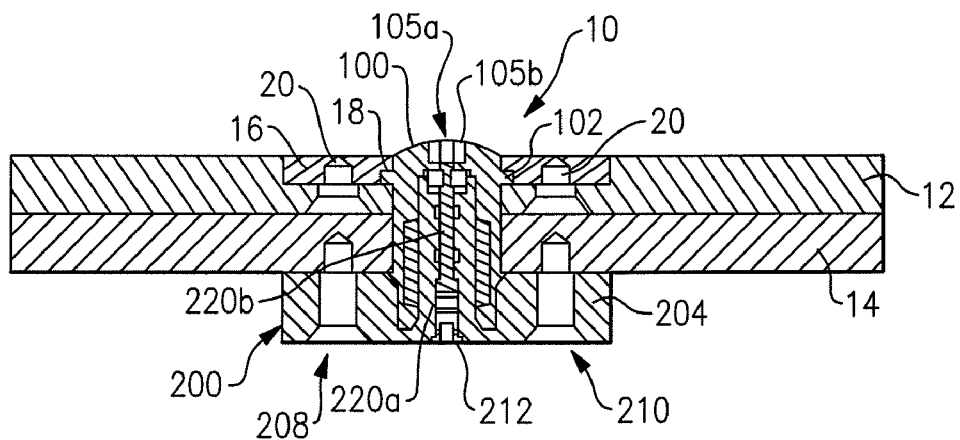
FIG. 2 is a cross-sectional view of the assembled captive fastener taken along section line 2-2 of FIG. 1.
Figure 3:
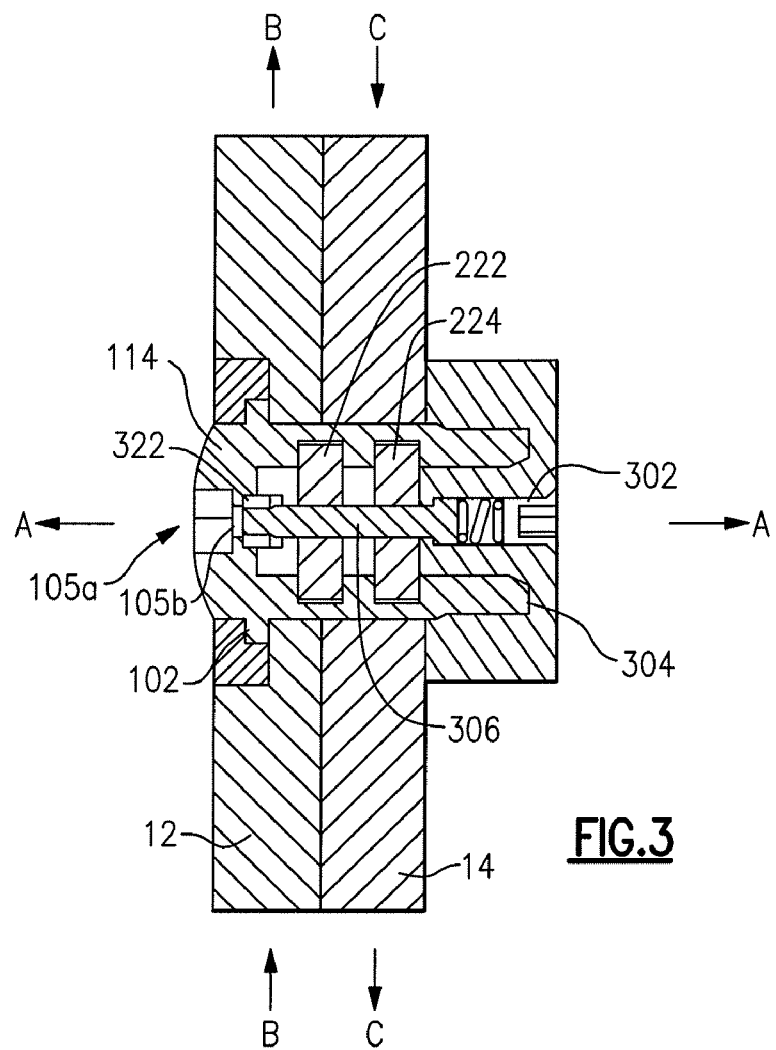
FIG. 3 is a cross-sectional view of the assembled captive fastener taken along section line 3-3 of FIG. 1.
Figure 4:
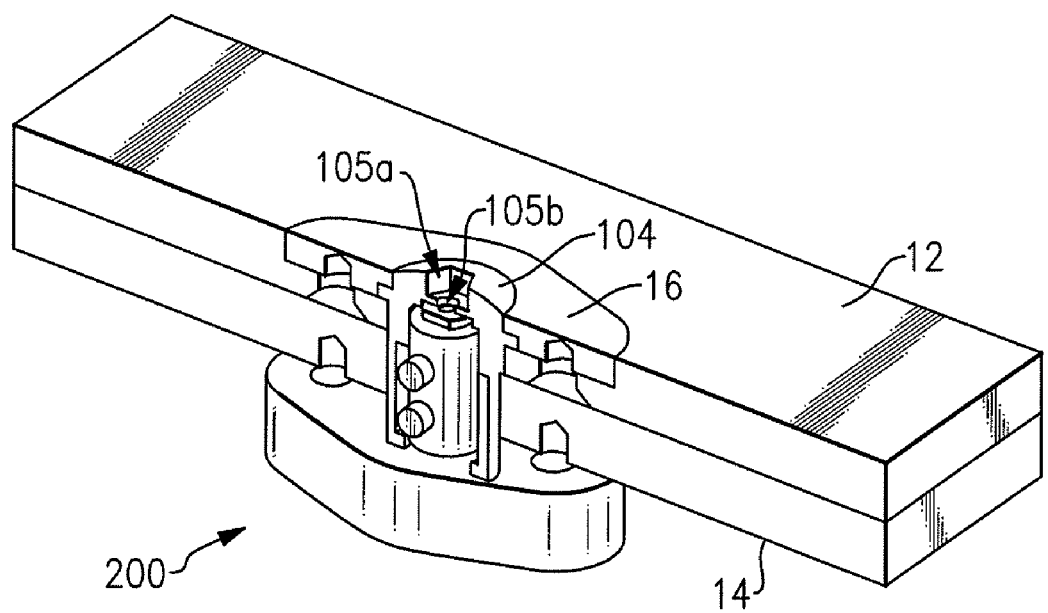
FIG. 4 is a partial cut-away perspective view revealing features of the bayonet assembly portion of the assembled captive fastener.
Figure 5:
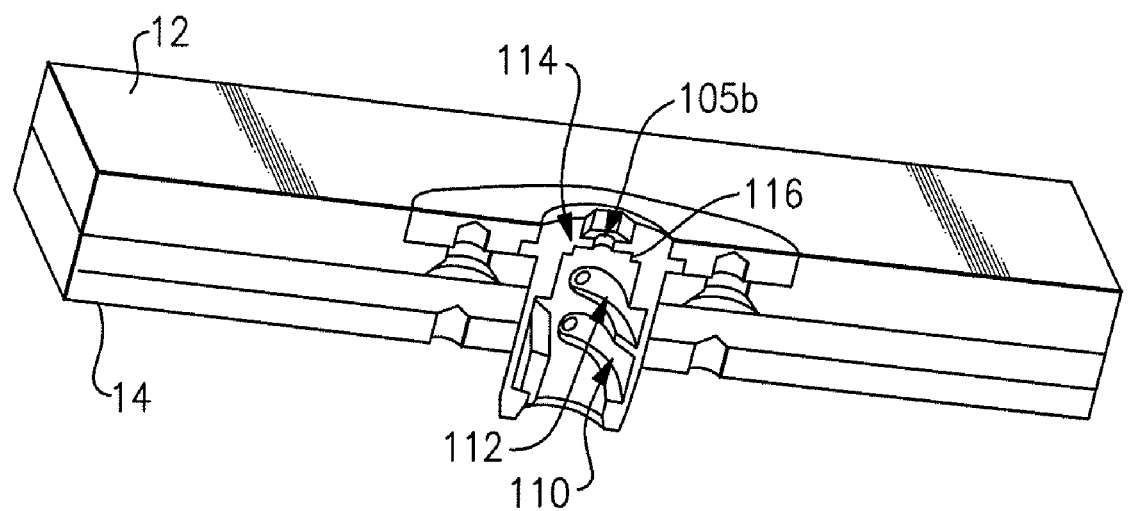
FIG. 5 is a partial cut-away perspective view revealing features of the receptacle assembly portion of the assembled captive fastener.
Figure 6:
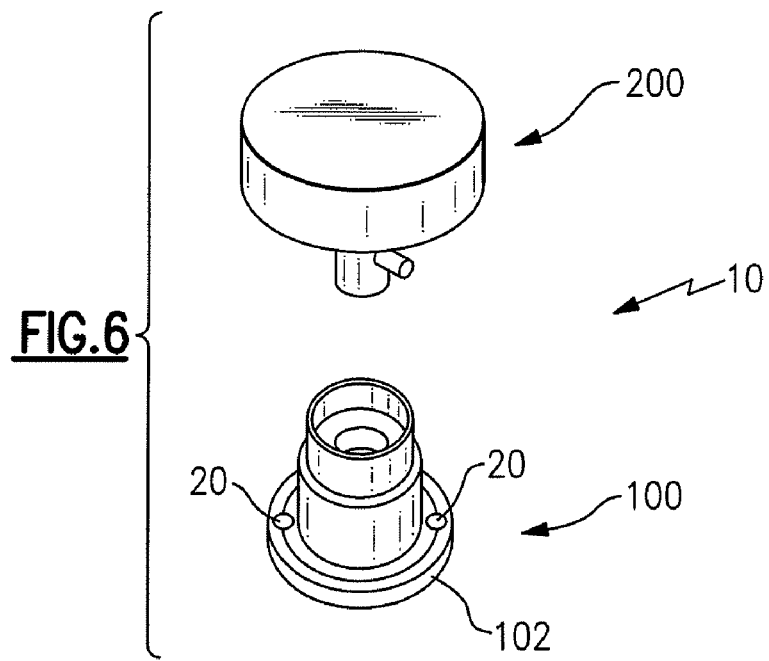
FIG. 6 is an exploded perspective view of the receptacle and bayonet assemblies.
Figure 7:
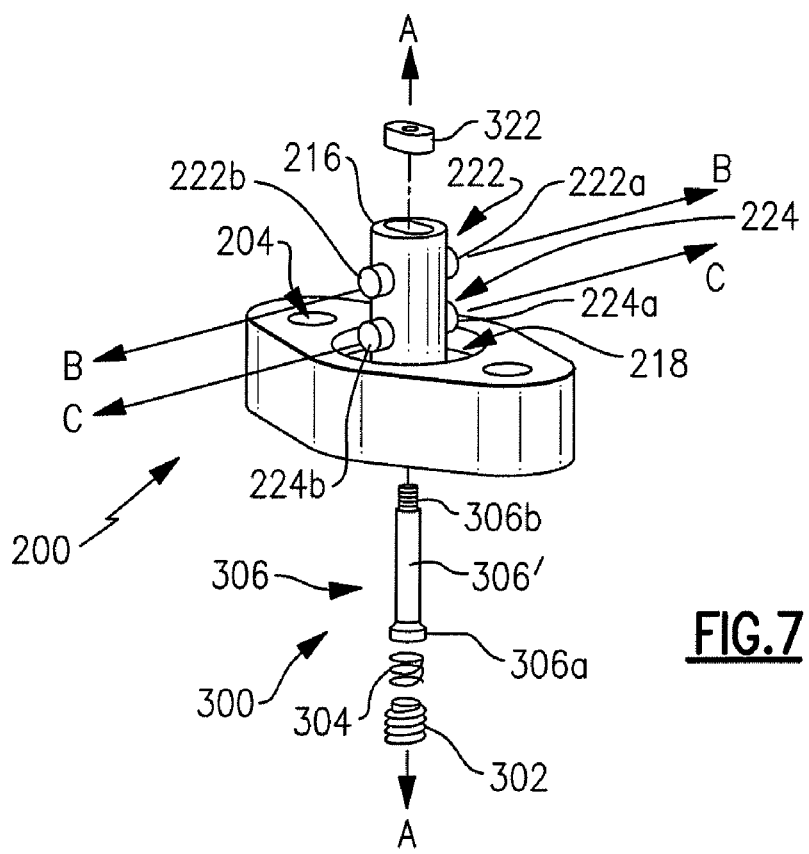
FIG. 7 is an exploded perspective view of the bayonet and locking assemblies.
Figure 8:
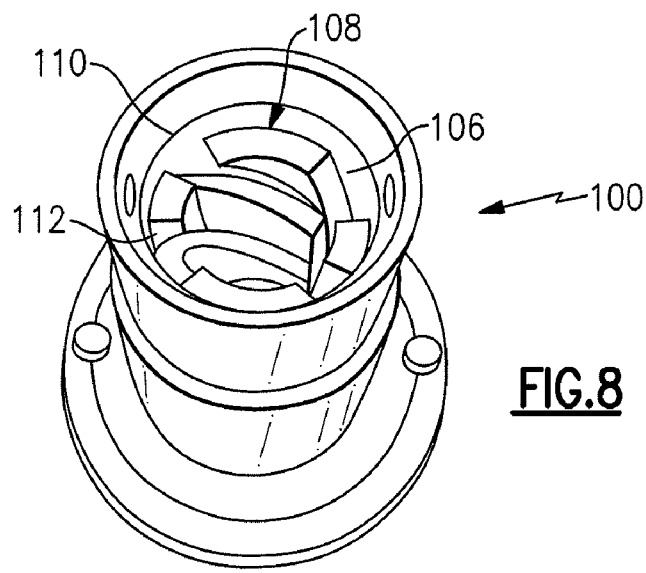
FIG. 8 is a perspective view of the receptacle assembly.
Figure 9:
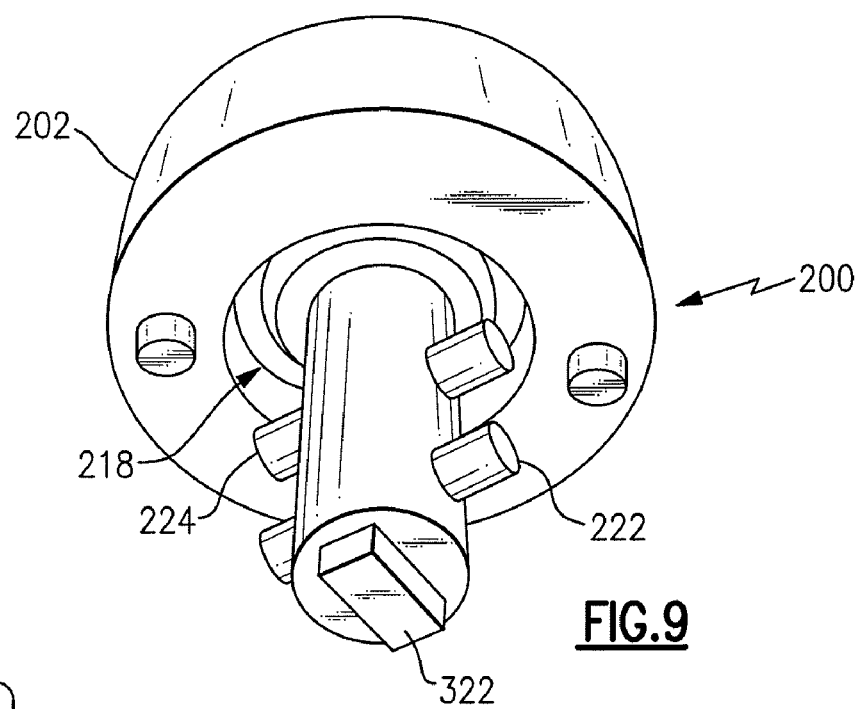
FIG. 9 is a perspective view of the bayonet assembly.
Figure 10:
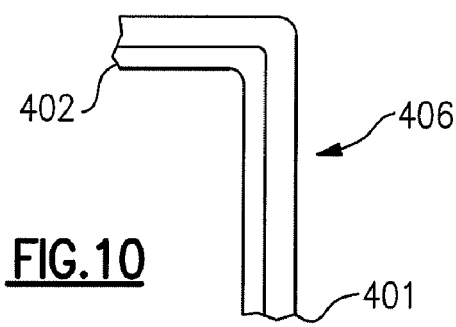
FIG. 10 is a perspective view of a tool used to engage or disengage the bayonet assembly relative to the receptacle.

With reference to the drawings, in which like reference numerals refer to like parts throughout, there is seen in the Figures a captive fastener, designated generally by reference numeral 10, a plurality of which may be used to fasten a removable panel 12 to a fixed substructure 14. Captive fastener 10 generally comprises a receptacle 100, a bayonet assembly 200, and a locking assembly 300 that lockingly engages and permits disengagement of bayonet assembly 200 relative to receptacle 100. More specifically, receptacle 100 is secured to removable panel 12 by a head 16 that including a countersunk opening 18 that receives and clamps a circumferential flange 102 formed on the head 104 of receptacle 100 between itself and panel 12. A pair of rivets 20 fasten head 16 to panel 12, thereby creating a unitary assembly of panel 12 and receptacle 100.

Bayonet assembly 200 is secured to fixed substructure 14 by a pair of bolts or other fasteners that extend through a pair of openings 202 formed through the head 204 of bayonet assembly 200. As will be described hereinafter, bayonet assembly 200 is lockingly received within receptacle 100, thereby providing the secure engagement of removable panel 12 to substructure 14.

Receptacle 100 comprises a pair of concentric openings 105a, b formed through head 104, an elongated shaft 106 that extends along axis A-A and defines a bore 108 therein. Opening 105a is hex-shaped and positioned on the exterior side of head 104 and is of a larger dimension than opening 105b with which it is in fluid communication (openings 105a, 105b can be any non-circular shape, including, for example, slotted/oval, star-shaped, cross-shaped, square-shaped, and the like). The interior wall of shaft 106 that defines bore 108 includes a pair of raceways 110, 112 formed therein that extend axially from the open end of bore 108 along parallel, spiral tracks (the entry into bore 108 along raceways 110, 112 begins with a short straight section of raceway (common to both raceways 110, 112) prior to the spiral pathway beginning). The spiral tracks are spaced a predetermined distance apart (approximately equal to the length of the short straight section that leads to the spiral path, which as will be described infra is about the same as the spacing of the bayonets top be described hereinafter) and preferably extend between 120 degrees to 180 degrees around the interior surface, with 120 degrees being the most preferred when raceways 110, 112 include a steep lead angle, as will be described in further detail hereinafter (as this geometry provides a secure connection and requires less than a complete turn of the receptacle to effect disengagement of the receptacle 100 from the bayonet assembly 200.) Raceways 110, 112 terminate at an intermediate position along bore 108 and immediately prior to the formation of a keyway 114 that is defined by a shoulder 116.

Bayonet assembly 200 comprises an elongated head 202 that serves to interconnect assembly 200 to fixed substructure 14 via a pair of fasteners 204, 206 that pass through opposed openings 208, 210, respectively. The outer surface of head 202 includes a small, tapped opening 212 in which a set screw 302 (given a 300 series number as it forms part of what is being referred to as locking assembly 300) is securely positioned. An elongated shaft 216 extends upwardly from the interior surface of head 202 and is concentrically and circumferentially surrounded by a gap 218 formed in the interior surface of head 202, with tapped opening 212 being concentrically formed within shaft 216. Tapped opening 212 leads to a slightly larger diameter opening 220a that extends for a predetermined distance before stepping inwardly to a slightly smaller diameter opening 220b that collectively and co-axially extend fully through shaft 216.

Shaft 216 extends a length approximately the same length as bore 208, as it will ultimately be received therein. A pair of bayonets 222, 224 extend perpendicularly outwardly from shaft 216 along respective, parallel axes B-B and C-C. Each bayonet 222, 224 includes a pair of ears 222a, b and 224a, b that extend from diametrically opposed sides of shaft 216, and the total length of bayonets 222, 224 is just slightly less than the distance separating the entry paths to raceways 110, 112, but grater than the diameter of bore 108, thus causing bayonets 220, 224 to ride within raceways 110, 112 without being capable of becoming disengaged therefrom. It should be noted that fastener 10 would work with a single eared bayonet, or more than two two-eared bayonets, each bayonet, and two ears for each providing added strength to the fastener. Bayonets 222, 224 are spaced a distance from one another that equals the distance separating raceways 110, 112.

Locking assembly 300 comprises set screw 302 that is securely positioned within tapped opening 212, as described supra, a bias member (e.g., coil spring or other member that provides a longitudinally directed biasing force) 304 that is positioned adjacent set screw 302 within opening 220a, an elongated plunger 306 that includes a head 306a of a diameter that is slightly smaller than the diameter of opening 220a and is positioned therein, and an extended region 306b of a diameter slightly smaller than that of opening 220b and extends therein. Threaded or otherwise secured to the end of plunger region 320b is a key 322 of non-circular shape that conformingly sits within a notched out end 226 of shaft 216 and is of too large a dimension as to fit within opening 220b. In its neutral state (which is actually a slightly compressed state to prevent free movement of plunger 320 within bayonet assembly 200), bias member 304 forces plunger head 320a against the stepped region forming the interface between opening section 220a and 220b (which serves to secure plunger 320 within opening 220), and positions key 322 out of engagement with notched out end 226, but when fully compressed with position key 322 substantially fully within the confines of notched out end 226.

To lock bayonet assembly 200 to receptacle 100, one would use a tool 400 having an end 401 that is sized to engage opening 105a, but not 105b, and using the tool would push shaft 106 over shaft 216 with bayonets 222, 224 aligned with the common entry path for raceways 110, 112. Once bayonets 222, 224 enter raceways 110, 112, respectively, receptacle 100 can continue to be longitudinally pushed using tool 400 and also rotated about its longitudinal axis due to the bayonets 222, 224 riding along raceways 110, 112. When bayonets 222, 224 almost reach the end of raceways 110, 112, key 332 will become engaged with shoulder 116. At this point, the final twist of receptacle 100 about its longitudinal axis using tool 400 will align key 332 with the correspondingly shaped keyway 114 and bias member 304 will decompress and force key 332 into keyway 114, and plunger head 220a into engaged relation with the shoulder that defines the boundary between opening sections 220 and 220b. The non-circular shape of key 332 and keyway 114 prevents rotation of receptacle 100 relative to bayonet assembly 200. Furthermore, the final path of raceways 110, 112 which terminates with the seating position for bayonets 222, 224, is either straight or slightly in the opposite direction than the majority of the path, to prevent inadvertent back travel.

To disengage receptacle 100 from bayonet assembly 200, tool 400 includes an end 402 that is sized to pass through opening 105b (and hence also opening 105a since it is larger than opening 105b and on the exterior side of head 104) is passed therethrough and into engaged relation with key 332. Longitudinal force is continually applied by tool 400 to key 332 until bias member 304 is compressed and key 332 is disengaged from keyway 114. Tool 400 also includes a hex shaped portion 404 that is adapted to securely and operably engage opening 105a after portion 402 has disengaged key 332 from keyway 114. Therefore, after key 332 has been disengaged from keyway 114, tool portion 404 is in engaged relation to opening 105a and used to rotate receptacle 100 about its longitudinal axis such that bayonets 222, 224 ride along raceways 110, 112 and key 332 is positioned out of alignment with keyway 114. Slightly rotating receptacle 100 about its longitudinal axis causes bayonets 222, 224 to ride along raceways 110, 112 and after a relatively short distance of longitudinal travel along bore 108, receptacle 100 can be freely pulled off of bayonet assembly 200. With a relatively steep lead angle for raceways 110, 112, it is possible that is as little as a quarter turn of receptacle about its longitudinal axis will result in disengagement from bayonet assembly 200.

It should be noted that the amount that raceways 110, 112 spiral around bore 108 and the angle at which they spiral can be varied with the geometry dictating the amount of rotation that must be imparted to receptacle to effect its disconnection from bayonet assembly 200.

What is claimed is:

1. A captive fastener, comprising:
   a. a receptacle extending along a longitudinal axis and including a bore formed longitudinally therein that is defined by an interior surface and extends from its open end to a shoulder formed within said receptacle, a first raceway formed in said interior surface and extending in a predetermined pattern along at least a portion of the length of said interior surface, and a keyway formed in axial alignment and fluid communication with said bore, said keyway being formed in said shoulder in substantial axial alignment with said longitudinal axis;
   b. a bayonet assembly comprising an elongated, hollow shaft adapted for axial engagement of said receptacle and within said bore, and a first bayonet extending outwardly from said shaft and adapted for seated engagement within said first raceway; and
   c. a locking assembly mounted for reciprocal, axial movement within said hollow shaft, said locking assembly extending though said bayonet assembly and said bore to lockingly engage said keyway.

2. The captive fastener according to claim 1, wherein said predetermine pattern is a spiral.

3. The captive fastener according to claim 2, wherein said spiral pattern extends longitudinally along said interior surface and revolves between about 120 and 180 degrees around said interior surface.

4. The captive fastener according to claim 3, wherein said spiral pattern extends longitudinally along said interior surface and revolves about 120 degrees around said interior surface.

5. The captive fastener according to claim 1, further comprising a second raceway formed in said interior surface that extends along a parallel predetermined pattern relative to said first raceway.

6. The captive fastener according to claim 5, further comprising a second bayonet extending outwardly from said shaft axially spaced from said first bayonet, said second bayonet being adapted for seated engagement within said second raceway.

7. The captive fastener according to claim 6, wherein said first and second bayonets each comprise first and second ears with each pair of first and second ears extending along respective first and second bayonet axes that are parallel to one another and transverse to said shaft.

8. The captive fastener according to claim 1, wherein said locking assembly comprises:
   a. an elongated plunger longitudinally positioned with said hollow shaft;
   b. a set screw statically positioned in said hollow shaft in axial alignment with said plunger;
   c. a bias element positioned within said shaft between said set screw and said plunger; and
   d. a non-circularly shaped key securely mounted to the end of said plunger opposite said bias element and adapted for movement into and out of said keyway.

9. The captive fastener according to claim 1, wherein said receptacle further comprises a head region and a flange circumferentially extending around said head region, said head region including first and second axially aligned openings formed therethrough.

10. The captive fastener according to claim 9, wherein said first opening is of a first predetermined dimension and extends interiorly from the exterior of said head region, and said second opening is of a second predetermined dimension smaller than said first predetermined dimension and extends co-axially and in fluid communication between said first opening and said keyway.

11. The captive fastener according to claim 10, wherein said first opening is hexagonal.

12. The captive fastener according to claim 1, further comprising a locking head that includes a countersunk opening formed therethrough that is adapted to be positioned in clamping relation to said circumferential flange formed on said head of said receptacle.

* * * * *

UNITED STATES PATENT AND TRADEMARK OFFICE
CERTIFICATE OF CORRECTION

| | | |
|---|---|---|
| PATENT NO. | : 7,748,939 B2 | Page 1 of 1 |
| APPLICATION NO. | : 11/747591 | |
| DATED | : July 6, 2010 | |
| INVENTOR(S) | : Jeffrey A. Bulow, Ronald D. Gagnon and Jeramy K. Amidon | |

It is certified that error appears in the above-identified patent and that said Letters Patent is hereby corrected as shown below:

Column 5, claim 1c, line 55, please delete "though" and replace with -- through --

Signed and Sealed this
Fourth Day of January, 2011

David J. Kappos
*Director of the United States Patent and Trademark Office*